United States Patent
Lee et al.

(10) Patent No.: US 10,324,330 B2
(45) Date of Patent: Jun. 18, 2019

(54) DISPLAY APPARATUS

(71) Applicant: Samsung Display Co., Ltd., Yongin-si, Gyeonggi-do (KR)

(72) Inventors: Eunjung Lee, Yongin-si (KR); Suyoung Kim, Seoul (KR); Jongho Chong, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/698,578

(22) Filed: Sep. 7, 2017

(65) Prior Publication Data

US 2018/0113358 A1    Apr. 26, 2018

(30) Foreign Application Priority Data

Oct. 20, 2016    (KR) .................. 10-2016-0136775

(51) Int. Cl.
| | | |
|---|---|---|
| *G02B 27/01* | (2006.01) | |
| *G02F 1/1335* | (2006.01) | |
| *G02F 1/1347* | (2006.01) | |
| *H01L 51/52* | (2006.01) | |

(Continued)

(52) U.S. Cl.
CPC ...... *G02F 1/133526* (2013.01); *G02F 1/1347* (2013.01); *G02F 1/13471* (2013.01); *G02F 1/133512* (2013.01); *G02F 1/133528* (2013.01); *H01L 27/3232* (2013.01); *H01L 51/5262* (2013.01); *H01L 51/5275* (2013.01); *H01L 51/5281* (2013.01); *H01L 51/5284* (2013.01); *G02B 27/0172* (2013.01);

(Continued)

(58) Field of Classification Search
CPC ............. G02F 1/133526; G02F 1/1347; G02F 1/13471; G02F 1/133512; G02F 1/133528; G02F 2001/133531; G02F 2001/133388; G02F 2201/44; H01L 51/5262; H01L 51/5281; H01L 51/5284; H01L 51/5275; H01L 27/3232; G02B 27/0172

See application file for complete search history.

(56) References Cited

U.S. PATENT DOCUMENTS

| | | |
|---|---|---|
| 8,957,835 B2 | 2/2015 | Hoellwarth |
| 2014/0035800 A1 | 2/2014 | Lee et al. |

FOREIGN PATENT DOCUMENTS

| | | |
|---|---|---|
| KR | 10-1172664 B1 | 8/2012 |
| KR | 10-1189845 B1 | 10/2012 |

(Continued)

*Primary Examiner* — Jessica M Merlin
(74) *Attorney, Agent, or Firm* — Lewis Roca Rothgerber Christie LLP

(57) ABSTRACT

A display apparatus includes a first panel including a plurality of pixel areas configured to provide an image, and a non-pixel area around the plurality of pixel areas, a lens unit on the first panel and configured to enlarge the image by a magnitude of N to generate a display image, a second panel on the lens unit, the second panel being larger than the first panel by a magnitude of N, and including a plurality of non-active areas corresponding to the plurality of pixel areas, and an active area around the plurality of non-active areas, and corresponding to the non-pixel area, a first substrate including a first electrode at the active area, a second substrate including a second electrode facing the first electrode, and a light transmission adjusting layer between the first substrate and the second substrate, wherein N is a rational number greater than 1.

16 Claims, 12 Drawing Sheets

(51) Int. Cl.
    *H01L 27/32*        (2006.01)
    *G02F 1/1333*       (2006.01)
(52) U.S. Cl.
    CPC ............ *G02F 2001/133388* (2013.01); *G02F 2001/133531* (2013.01); *G02F 2201/44* (2013.01); *H01L 27/3269* (2013.01)

(56) References Cited

FOREIGN PATENT DOCUMENTS

| KR | 10-2013-0067339 A | 6/2013 |
| KR | 10-2016-0092416 A | 8/2016 |

DISPLAY APPARATUS

CROSS-REFERENCE TO RELATED APPLICATION

This patent application claims priority to and the benefit of Korean Patent Application No. 10-2016-0136775, filed on Oct. 20, 2016, the entire contents of which are incorporated by reference herein.

BACKGROUND

The present disclosure relates to a display apparatus.

DESCRIPTION OF THE RELATED ART

An electronic apparatus, such as a smartphone, a digital camera, a notebook computer, a navigation device, or a smart television, that provides an image to a user, includes an image display apparatus for displaying an image. The image display apparatus may include a display panel for generating an image and the image generated by the display panel may be provided to the user.

Various display panels, such as a liquid crystal display panel, an organic light emitting display panel, an electrowetting display panel, and an electrophoretic display panel are being developed.

Recently, a head mounted display (HMD) technology is being developed, which enlarges an image generated by a display panel and provides the enlarged image to a user in order to realize or provide a virtual reality. The head mounted display is typically a display apparatus mounted on the user's head, and may enlarge an image generated by the display panel at a prescribed magnification and may provide the enlarged image to the user.

The above information disclosed in this Background section is only for enhancement of understanding of the background of the described technology and therefore it may contain information that does not form the prior art that is already known in this country to a person of ordinary skill in the art.

SUMMARY

Aspects of embodiments of the present disclosure are directed toward a display apparatus for preventing a non-pixel area from being visually recognized, or that reduces the likelihood thereof.

An embodiment of the inventive concept provides a display apparatus including: a first panel including: a plurality of pixel areas configured to provide an image; and a non-pixel area around the plurality of pixel areas; a lens unit on the first panel and configured to enlarge the image by a magnitude of N to generate a display image; and a second panel on the lens unit, the second panel being larger than the first panel by a magnitude of N, and comprising: a plurality of non-active areas corresponding to the plurality of pixel areas; and an active area around the plurality of non-active areas, and corresponding to the non-pixel area; a first substrate including a first electrode at (e.g., in) the active area; a second substrate including a second electrode facing the first electrode; and a light transmission adjusting layer between the first substrate and the second substrate, wherein N is a rational number greater than 1.

In an embodiment, the display may include: a plurality of image display areas corresponding to the plurality of pixel areas; and an image non-display area around the plurality of image display areas and corresponding to the non-pixel area, wherein the non-active areas overlap the image display areas and the active area overlaps the image non-display area.

In an embodiment, the light transmission adjusting layer may be configured to transmit light in the non-active areas and may be configured to adjust a light transmission amount in the active area.

In an embodiment, the light transmission adjusting layer may include a liquid crystal layer.

In an embodiment, the display apparatus may further include: a first polarizer at (e.g., on) a first surface of the first substrate, a plurality of first open units overlapping with the plurality of non-active areas being defined in the first polarizer, the first polarizer having a first polarization axis; and a second polarizer at (e.g., on) a second surface of the second substrate, a plurality of second open units overlapping with the plurality of non-active areas being defined in the second polarizer, the second polarizer having a second polarization axis.

In an embodiment, the first polarization axis and the second polarization axis may intersect with each other, and the liquid crystal layer may include a vertical alignment (VA) mode liquid crystal.

In an embodiment, the first polarization axis and the second polarization axis may be parallel to each other, and the liquid crystal layer may include a twisted nematic (TN) mode liquid crystal.

In an embodiment, the liquid crystal layer may adjust a light transmissivity in the active area according to a voltage difference between a first voltage applied to the first electrode and a second voltage applied to the second electrode, and a voltage level of the first voltage may be variable and the second voltage may be a constant voltage level.

In an embodiment, the display apparatus may further include a controller configured to detect a brightness of the first panel and configured to adjust the voltage level of the first voltage according to the detected brightness.

In an embodiment, the controller may be configured to control the voltage level of the first voltage such that the voltage difference between the first voltage and the second voltage increases as the brightness of the first panel increases.

In an embodiment, the first panel may include organic light emitting diodes respectively at (e.g., in) ones of the pixel areas from among the plurality of pixel areas.

In an embodiment, the first panel may further include a pixel-defined layer at (e.g., in) the non-pixel area.

In an embodiment, the first panel may include liquid crystal display elements respectively at (e.g., in) ones of the pixel areas from among the plurality of pixel areas.

In an embodiment, the first panel may further include a black matrix at (e.g., in) the non-pixel area.

In an embodiment, the second electrode may be entirely at (e.g., on) the second substrate.

In an embodiment, the second electrode may be at (e.g., in) the active area on the second substrate.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
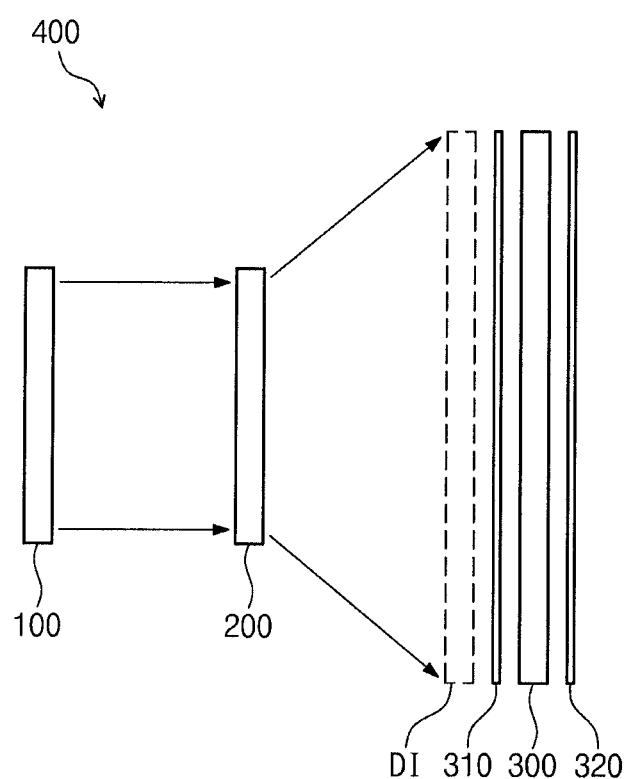
FIG. 1 schematically illustrates a side view of a structure of a display apparatus according to an embodiment of the inventive concept.

Aspects and features of the present invention, and methods for achieving the same are described herein with reference to exemplary embodiments described later in detail together with the accompanying drawings. However, the present invention is not limited to the following exemplary embodiments, but may be realized in various forms. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. The present invention should be defined by only the scope of the accompanying claims, and their equivalents. Unless otherwise noted, throughout this specification, like numerals refer to like elements. In the drawings, the relative sizes of elements, layers, and regions may be exaggerated for clarity.

When an element or a layer is referred to as being 'on' another element or layer, it can be directly on the other element or layer, or intervening layers or elements may also be present. In contrast, when an element or layer is referred to as being "directly on" another element or layer, there are no intervening elements or layers present. The term "and/or" includes any and all combinations of each and one or more of the associated listed items.

Spatially relative terms, such as "upper," "top," "lower," "bottom," and the like, may be used herein for ease of description to describe one element or feature's relationship to other element(s) or feature(s), as illustrated in the figures. It will be understood that the spatially relative terms are intended to encompass different orientations of the device in use or operation in addition to the orientation depicted in the figures. For example, if the device in the figures is turned over, elements described as being at a "bottom" of other elements or features would then be oriented at a "top" of the other elements or features. Thus, the example terms "bottom" and "top" can encompass both an orientation of a bottom and a top. The device may be otherwise oriented (e.g., rotated 90 degrees or at other orientations) and the spatially relative descriptors used herein should be interpreted accordingly.

It will be understood that when an element or layer is referred to as being "on" or "connected to" another element or layer, it can be directly on or connected to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

Also, though terms like "first" and "second" are used to describe various elements, members, components, regions, layers, and/or sections in various embodiments of the present invention, the elements, members, components, regions, layers, and/or sections are not limited by these terms. These terms are used only to differentiate or distinguish one element, member, component, region, layer or section from another element, member, component, region, layer or section. Therefore, a first element, a first member, a first component, a first region, a first layer, or a first section referred to below may be referred to as a second element, a second member, a second component, a second region, a second layer, or a second section within the spirit and scope of the present disclosure.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the terms "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." In addition, the use of alternative language, such as "or," when describing embodiments of the present invention, refers to "one or more embodiments of the present invention" for each corresponding item listed. As used herein, the terms "use," "using," and "used" may be considered synonymous with the terms "utilize," "utilizing," and "utilized," respectively. Also, the term "exemplary" is intended to refer to an example or illustration.

Example embodiments are described herein with reference to cross-sectional views and/or plan views that are schematic illustrations of example embodiments. As such, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing. Thus, the regions illustrated in the figures are schematic in nature and their shapes may be intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, exemplary embodiments of the present invention are described in conjunction with the accompanying drawings.

FIG. 1 schematically illustrates a side view of a structure of a display apparatus according to an embodiment of the inventive concept. For convenience of explanation, FIG. 1 illustrates a side surface configuration of a display apparatus.

Referring to FIG. 1, a display apparatus 400 according to an embodiment of the inventive concept includes a first panel 100 configured to generate an image, a lens unit 200 disposed on the first panel 100 and configured to enlarge the image (e.g., to enlarge the image by N times or by a magnitude of N or by a scale of N), a second panel 300 disposed on the lens unit 200 and having a size that is larger than the first panel 100 by N times (or larger than the first panel 100 by a magnitude of N), and first and second polarizers 310 and 320 disposed on opposing side of the second panel 300 (e.g., the first polarizer 310 may be disposed at or on a bottom part (or first surface or lower surface) of the second panel 300 and the second polarizer 320 may be disposed at or on a top part (or second surface or upper surface) of the second panel 300). N may be a rational number greater than 1.

The first panel 100 may be defined as a display panel for displaying an image. An image that is enlarged by N times through the lens unit 200 may be provided to a user as a display image DI through the second panel 300. The lens unit 200 may not change the size of the image generated by the first panel 100 by various magnifications, but may enlarge (or may only enlarge) the size of the image by a fixed magnification (or a preset magnification or a predetermined magnification). For example, the lens unit 200 may enlarge the image generated by the first panel 100 by a magnitude of two (e.g., a predetermined two times size (or N=2)).

The display image DI, which is enlarged by the lens unit 200, may be provided to the user through the second panel 300 and the first and second polarizers 310 and 320. An image non-display part corresponding to a non-pixel area in the display image DI may not be visually recognized by the user through the second panel 300 and the first and second polarizers 310 and 320. Hereinafter, such a configuration is described in more detail.

Figure 2:
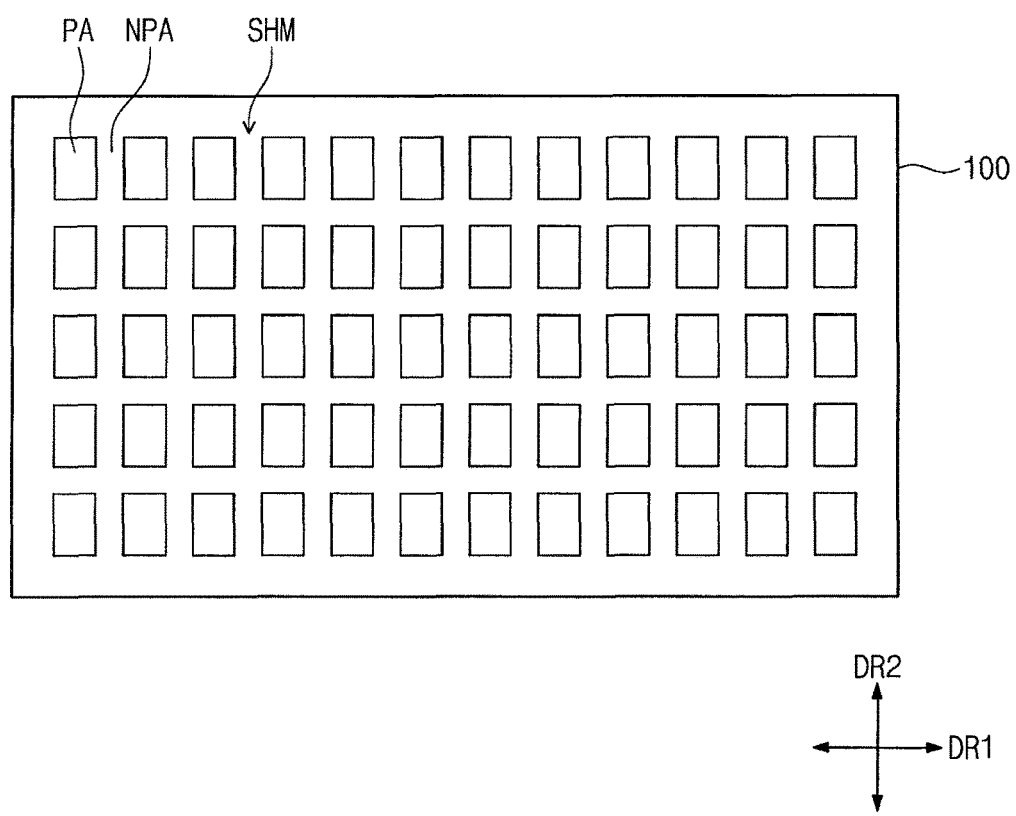
FIG. 2 exemplarily illustrates a plan view of a plane configuration of a first panel illustrated in FIG. 1.
Figure 3:
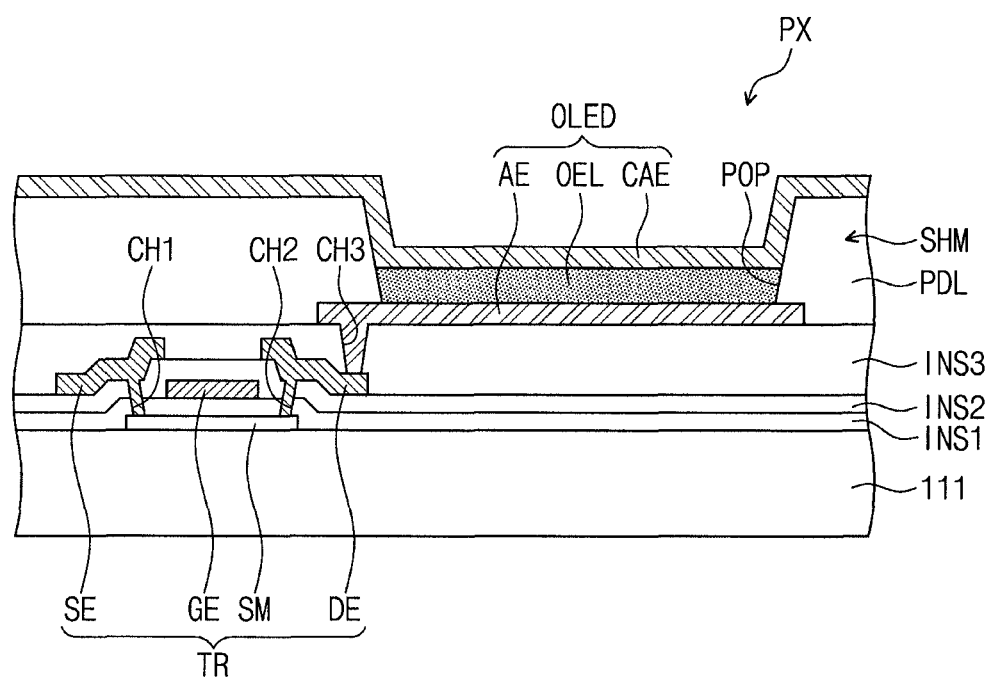
FIG. 3 exemplarily illustrates a cross-sectional view of a display element at pixel areas illustrated in FIG. 2.
Figure 4:
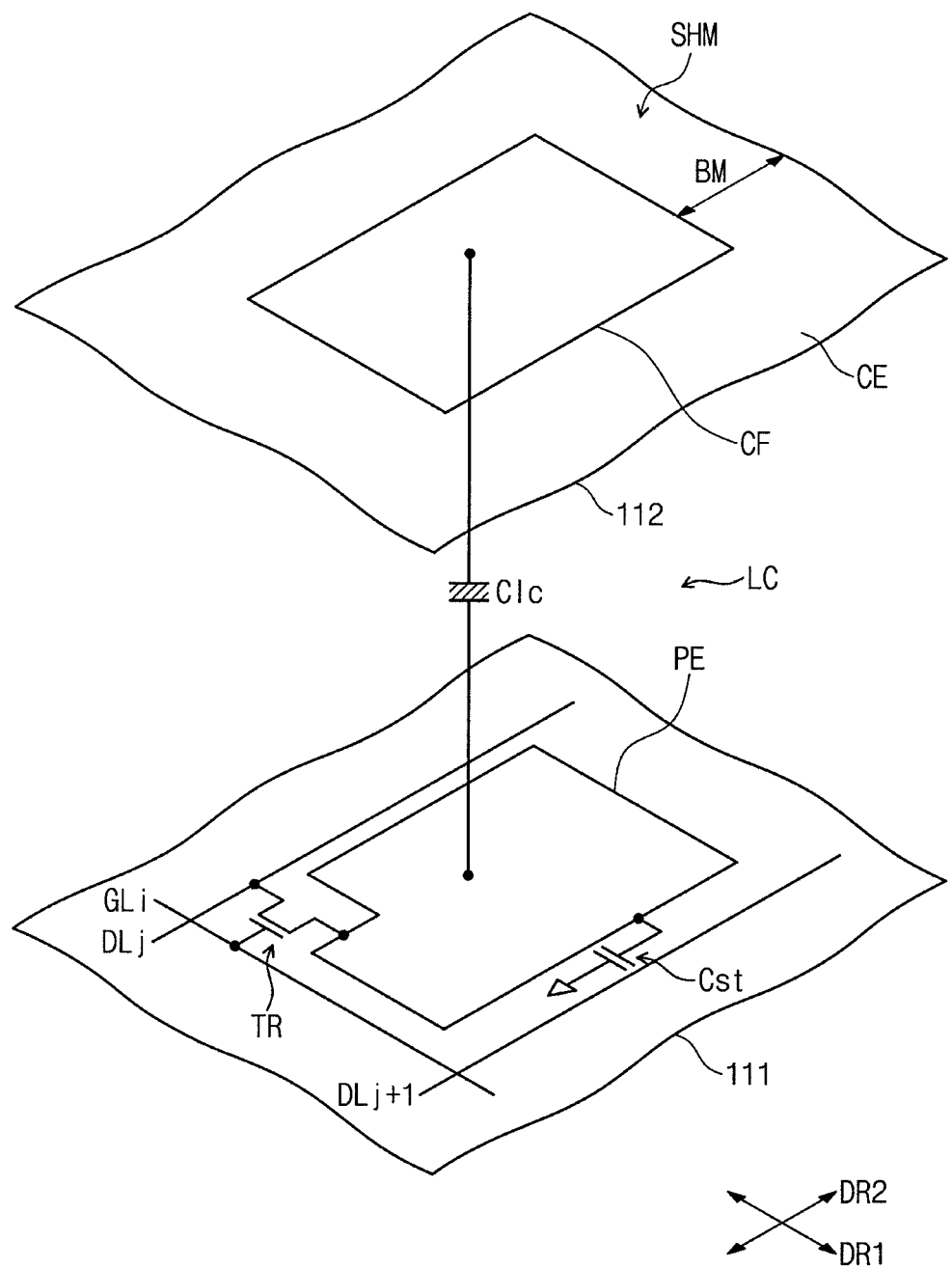
FIG. 4 exemplarily illustrates an exploded perspective view of a display element at pixel areas illustrated in FIG. 2.

FIG. 2 exemplarily illustrates a plan view of a plane configuration of the first panel illustrated in FIG. 1. FIG. 3 exemplarily illustrates a cross-sectional view of a display element at pixel areas illustrated in FIG. 2. FIG. 4 exemplarily illustrates an exploded perspective view of a display element at the pixel areas illustrated in FIG. 2.

Referring to FIG. 2, the first panel 100 may have a rectangular shape having long sides (or relatively long sides) extending in (or along) a first direction DR1 and short sides (or relatively short side) extending in (or along) a second direction DR2 intersecting (or crossing) with the first direction DR1. The first panel 100 is divided into a plurality of pixel areas PA and a non-pixel display area NPA disposed around the pixel areas PA. The pixel areas PA may generate an image for display (or may be configured to display an image), and the non-pixel area NPA may not display the image (or may not be configured to display the image).

Display elements for generating the image may be disposed in the pixel areas PA and a light shielding member SHM for shielding light may be disposed in the non-pixel area NPA. As an exemplary embodiment of the display elements, an organic light emitting diode OLED is illustrated in FIG. 3 and a liquid crystal display element is illustrated in FIG. 4.

Referring to FIG. 3, the organic light emitting diode OLED may be disposed in each pixel area PA as a display element. A transistor TR for driving the organic light emitting diode OLED may be disposed in (or at) the non-pixel area NPA. In some embodiments, a plurality of pixels PX may be disposed in (or at) the display panel 100, and each of the pixels PX may include the organic light emitting diode OLED and the transistor TR.

A semiconductor layer SM of the transistor TR is disposed on (or at) a base substrate 111. The semiconductor layer SM may include a semiconductor of an inorganic material such as amorphous silicon or polysilicon, an organic semiconductor, or an oxide semiconductor. In some embodiments, the semiconductor layer SM may include a source area, a drain area, and a channel area between the source area and the drain area.

A first insulation layer INS1 may be disposed on (or at) the base substrate 111 to cover the semiconductor layer SM. A gate electrode GE of the transistor TR overlapping the semiconductor layer SM may be disposed on (or at) the first insulation layer INS1. The gate electrode GE may be disposed to overlap the channel area of the semiconductor layer SM.

A second insulation layer INS2 may be disposed on (or at) the first insulation layer INS1 to cover the gate electrode GE. The second insulation layer INS2 may be defined as an interlayer insulation layer. The first insulation layer INS1 and the second insulation layer INS2 may be inorganic insulation layers including an inorganic material.

A source electrode SE and a drain electrode DE of the transistor TR may be separately disposed on (or at) the second insulation layer INS2. The source electrode SE may be connected to the source area of the semiconductor layer SM through a first contact hole (or first contact opening) CH1 that is provided by penetrating through the first insulation layer INS1 and the second insulation layer INS2. The drain electrode DE may be connected to the drain area of the semiconductor layer SM through a second contact hole (or second contact opening) CH2 that is provided by penetrating through the first insulation layer INS1 and the second insulation layer INS2.

A third insulation layer INS3 may be disposed on (or at) the second insulation layer INS2 to cover the source electrode SE and the drain electrode DE of the transistor TR. The third insulation layer INS3 may be an organic insulation layer including an organic material.

An anode electrode AE of the organic light emitting diode OLED may be disposed on the third insulation layer INS3. The anode electrode AE may be connected to the drain electrode DE of the transistor TR through a third contact hole (or third contact opening) CH3 that is provided by penetrating the third insulation layer INS3. The anode electrode AE may be defined as a pixel electrode.

A pixel-defined layer PDL exposing a portion (or a prescribed area or a predefined area) of the anode electrode AE may be disposed on (or at) the anode electrode AE and the third insulation layer INS3. The pixel-defined layer PDL may be a light shield member SHM and may have a black color for absorbing light. The pixel-defined layer PDL may provide an open unit POP exposing a portion (or a prescribed area or a predefined area) of the anode electrode AE. The open unit POP may correspond to the pixel area PA.

An organic light emitting layer OEL of the organic light emitting diode OLED may be disposed on (or at) the anode electrode AE in the open unit POP. The organic light emitting layer OEL may include an organic material capable of generating any one of red, green, and/or blue lights. Accordingly, the organic light emitting layer OEL may generate any one of the red, green, and/or blue lights. However, the present inventive concept is not limited thereto, and the organic light emitting layer OEL may, for example, generate white light by a combination of organic materials generating the red, green, and blue lights.

The organic light emitting layer OEL may have a multilayer structure in which a hole injection layer (HIL), a hole transporting layer (HTL), an emission layer (EML), an electron transporting layer (ETL), and an electron injection layer (EIL) are sequentially laminated.

A cathode electrode CAE of the organic light emitting diode OLED may be disposed on (or at) the pixel-defined layer PDL and the organic light emitting layer OEL. The cathode electrode CAE may be defined as a common electrode.

A driving power for allowing the organic light emitting layer OEL to emit light by the transistor TR may be applied to the anode electrode AE and a power having an opposite polarity to the driving power may be applied to the cathode electrode CAE. In this case, a hole and an electron injected to the organic light emitting layer OEL are combined to form an exciton and the exciton decays to the ground state to allow the organic light emitting diode OLED to emit light. The organic light emitting diode OLED may emit red, green and/or blue lights according to a current flow and display prescribed image information.

Referring to FIG. 4, a liquid crystal display element includes a pixel electrode PE, a common electrode CE, and a liquid crystal layer LC disposed between the pixel electrode PE and the common electrode CE. For example, a liquid crystal capacitor Clc may be defined as a liquid crystal display element and the liquid crystal display element may be disposed in each pixel area PA as a display element. A transistor TR for driving the liquid crystal display element is disposed in the non-pixel area NPA.

In some embodiments, when a plurality of pixels are disposed in a display panel 100, each of the pixels may include a transistor TR connected to a gate line GLi and a data line DLj, the liquid crystal capacitor Clc connected to the transistor TR, and a storage capacitor Cst connected in parallel to the liquid crystal capacitor Clc. In some embodiments, the storage capacitor Cst may be omitted. As used herein, i and j are natural numbers (or positive integers).

The transistor TR may be disposed on (or at) a first substrate 111. The transistor TR may include a gate electrode connected to the gate line GLi, a source electrode connected to the data line DLj, and a drain electrode connected to the liquid crystal capacitor Clc and the storage capacitor Cst.

The liquid crystal capacitor Clc may include the pixel electrode PE disposed in (or on or at) the first substrate 111, the common electrode CE disposed in (or on or at) a second substrate 112, and the liquid crystal layer LC disposed between the pixel electrode PE and the common electrode CE. The liquid crystal layer LC plays a role of a dielectric. The pixel electrode PE is connected to the drain electrode of the transistor TR.

In FIG. 4, the pixel electrode PE has a non-slit structure, but the present invention is not limited thereto. For example, the pixel electrode PE may have a slit structure including a stem part of a cross shape and a plurality of branch parts extending from the stem part in a radial form. The common electrode CE may be entirely disposed in the second substrate 112.

The storage capacitor Cst may include the pixel electrode PE, a storage electrode branched from a storage line, and an insulation layer disposed between the pixel electrode PE and the storage electrode. The storage lines may be disposed on the first substrate 111 and may also be disposed (or concurrently disposed or simultaneously disposed) on the same layer as the gate line GLi. The storage electrode may partially overlap the pixel electrode PE.

The pixel may further include a color filter CF representing one of red, green, and blue colors. As an exemplary embodiment, the color filter CF may be disposed in the second substrate 112, as illustrated in FIG. 4. However, the present inventive concept is not limited thereto, and the color filter CF may be disposed in (or on) the first substrate 111, for example.

As a light shield member SHM, a black matrix BM may be disposed between ones of the color filters CF. The black matrix BM may shield unnecessary light in realizing an image. The black matrix BM may shield a light leakage by an abnormal behavior of liquid crystal molecules, which may occur at an edge of the pixel area, or a mixed color that may appear at an edge of the color filter CF. The black matrix BM and the common electrode CE are shown in plan views in FIG. 4, but substantially, the common electrode CE is entirely disposed on the bottom part of the color filter CF and the black matrix BM.

The transistor TR is turned on in response to a gate signal provided through (or via) the gate line GLi. A data voltage received through the data line DLj is provided to the pixel electrode PE of the liquid crystal capacitor Clc through the turned on transistor TR. A common voltage is applied to the common electrode CE.

An electric field is formed between the pixel electrode PE and the common electrode CE by the level difference between the data voltage and the common voltage. Liquid crystal molecules in the liquid crystal layer LC are driven by the electric field formed between the pixel electrode PE and the common electrode CE. Light transmittance is adjusted to display an image by the liquid crystal molecules driven by the electric field.

A storage voltage having a constant voltage level may be applied to the storage line. However, the inventive concept is not limited thereto, and a common voltage may be applied to the storage line, for example. The storage capacitor Cst plays a role of compensating for a voltage charged in the liquid crystal capacitor Clc.

Figure 5:
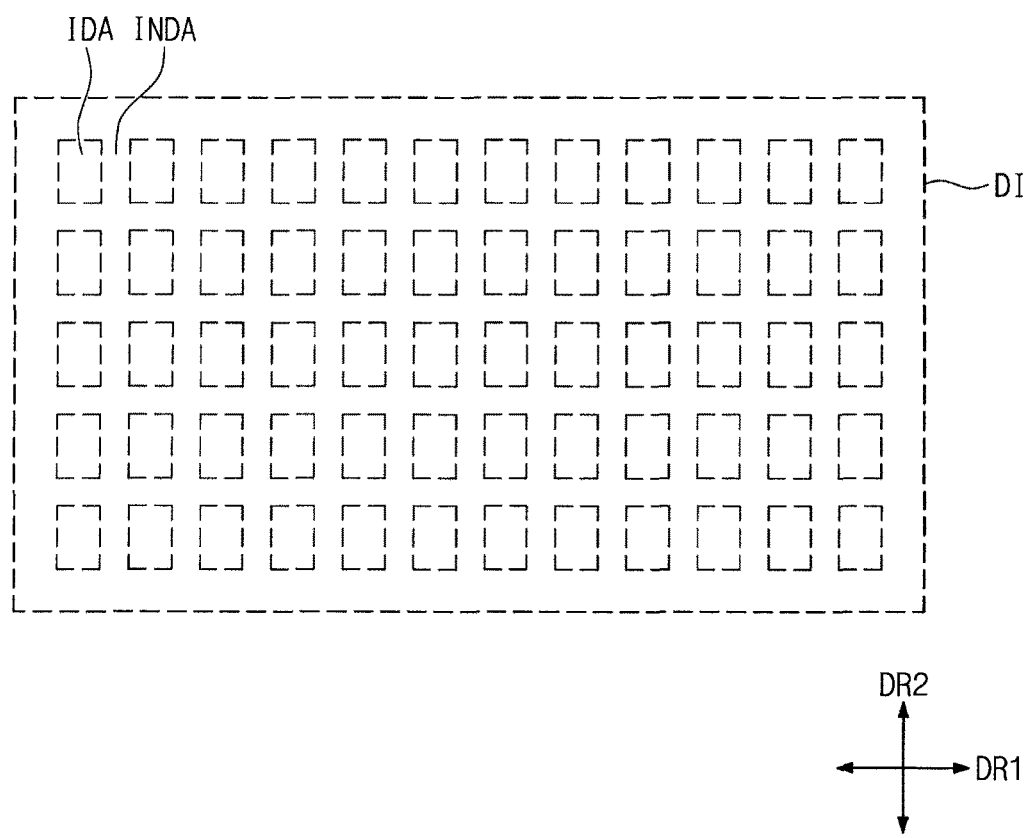
FIG. 5 schematically illustrates a plan view of a plane configuration of a display image illustrated in FIG. 1.
Figure 6:
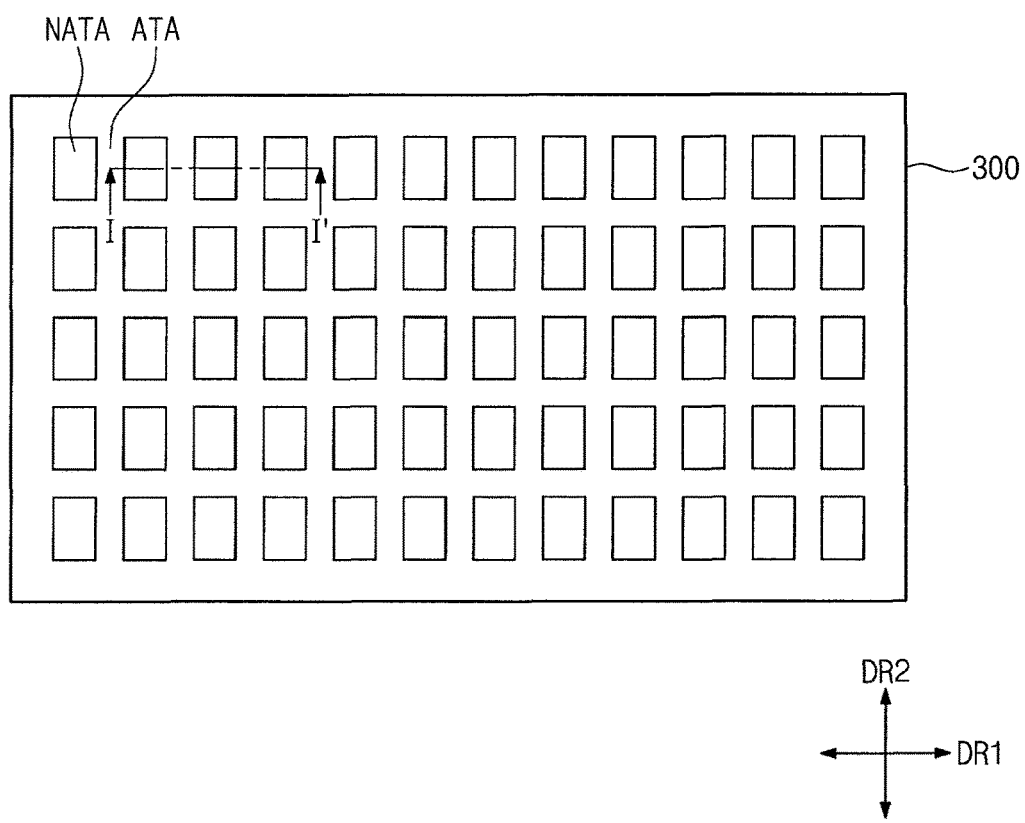
FIG. 6 schematically illustrates a plan view of a plane configuration of a second panel illustrated in FIG. 1.

FIG. 5 schematically illustrates a plan view of a plane configuration of the display image DI illustrated in FIG. 1. FIG. 6 schematically illustrates a plan view of a plane configuration of the second panel 300 illustrated in FIG. 1.

Referring to FIGS. 5 and 6, the display image DI may have a rectangular shape with long sides (or relatively long sides) in (or along) the first direction DR1 and short sides (or relatively short sides) in (or along) the second direction DR2. The display image DI may include a plurality of image display areas IDA and an image non-display area INDA disposed around each of the image display areas IDA.

The image display areas IDA may correspond to the pixel areas PA and the image non-display area INDA may correspond to the non-pixel area NPA. For example, the image display areas IDA and the image non-display area INDA may correspond to a shape in which the pixel areas PA and the non-pixel area NPA are enlarged a magnitude of N times.

Referring to FIG. 6, the second panel 300 may have a rectangular shape with long sides (or relatively long sides) in (or along) the first direction DR1 and short sides (or relatively short sides) in (or along) the second direction DR2. The second panel 300 is divided into a plurality of non-active areas NATA and an active area ATA disposed around each of the non-active areas NATA. The non-active areas NATA may be disposed to overlap the image display areas IDA and the active area ATA may be disposed to overlap the image non-display area INDA. For example, the non-active areas NATA may correspond to the image display areas IDA and the pixel areas PA and the active area ATA may correspond to the image non-display area INDA and the non-pixel area NPA.

Figure 7:
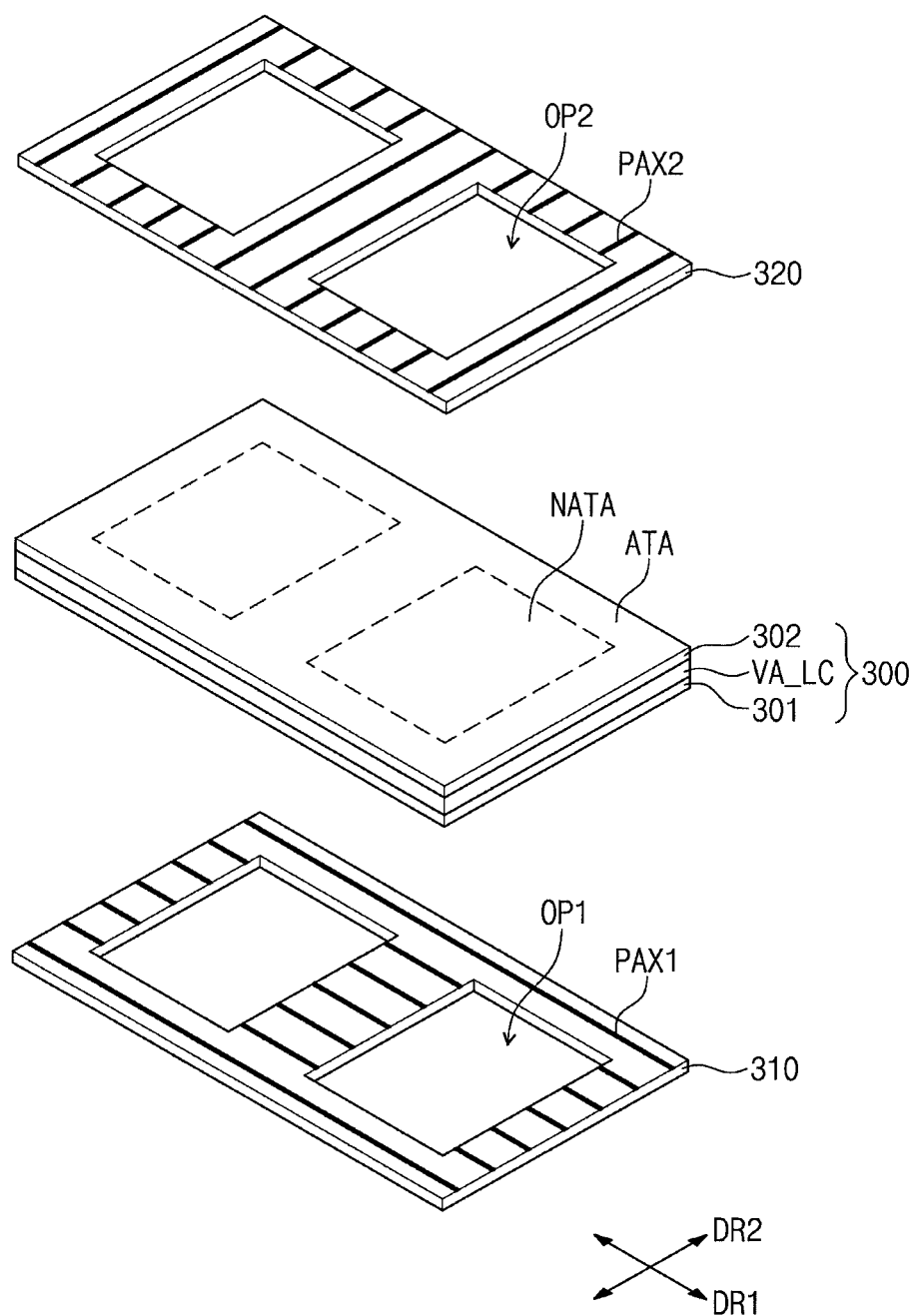
FIGS. 7-8 exemplarily illustrate exploded perspective views of various embodiments of a second panel and first and second polarizers illustrated in FIG. 1.
Figure 8:
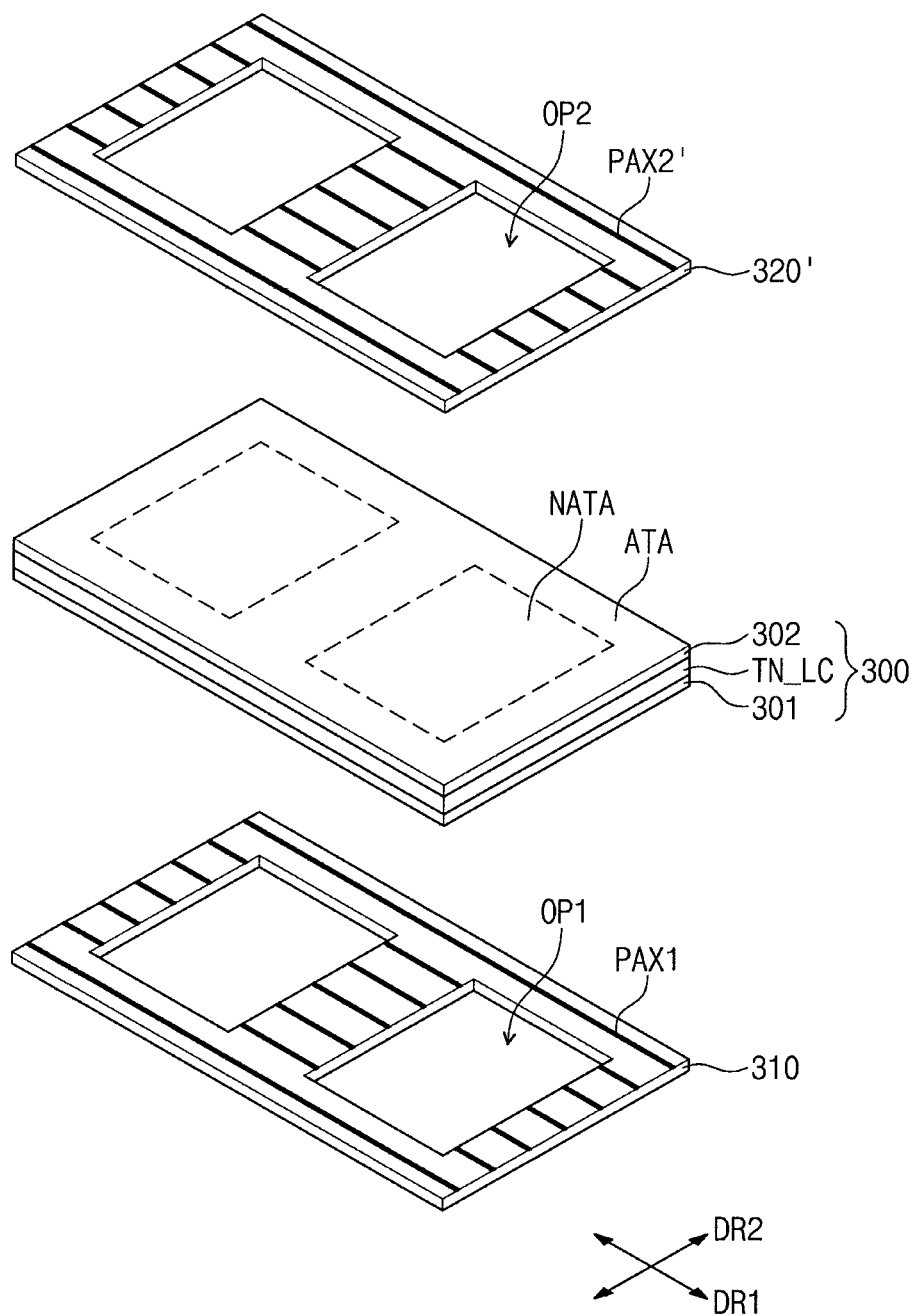

FIGS. 7 and 8 exemplarily illustrate exploded perspective views of various embodiments of the second panel 300 and the first and second polarizers 310 and 320 illustrated in FIG. 1.

For convenience of explanation, illustrated in FIGS. 7 and 8 are two non-active areas NATA of the second panel 300, an active area ATA adjacent to the two non-active areas NATA, and portions of the first and second polarizers 310 and 320 corresponding to the two non-active areas NATA and the active area ATA adjacent to the two non-active areas NATA.

Referring to FIG. 7, the second display panel 300 includes a first substrate 301, a second substrate 302 facing the first substrate 301, and a light transmission adjusting layer, for example, a liquid crystal layer VA_LC disposed between the first and second substrates 301 and 302. The liquid crystal layer VA_LC may include a vertical alignment (VA) mode liquid crystal.

The first polarizer 310 is disposed on (or at) a bottom surface (or lower surface or first surface) of the first substrate 301 and the second polarizer 320 is disposed on (or at) a top surface (or upper surface or second surface) of the second substrate 302. The first polarizer 310 may include a first polarization axis PAX1 having an optical axis that is parallel to the first direction DR1. A plurality of first open units OP1 are defined in the first polarizer 310, the first open units OP1 being defined as areas from which the first polarizer 310 is removed. The first open units OP1 are disposed to overlap the non-active areas NATA of the second panel 300.

The second polarizer 320 may include a second polarization axis PAX2 having an optical axis that is parallel to the second direction DR2. As such, the first polarization axis PAX1 and the second polarization axis PAX2 are disposed to intersect (or cross) with each other. A plurality of second open units OP2 are defined in the second polarizer 320, the second open units OP2 being defined as areas from which the second polarizer 320 is removed. The second open units OP2 are disposed to overlap the non-active areas NATA of the second panel 300.

For convenience of explanation, two first open units OP1 and two second open units OP2 corresponding to two non-active areas NATA are illustrated in FIG. 7, but substantially, the first open units OP1 and the second open units OP2 overlapping the non-active areas NATA illustrated in FIG. 6 may be defined on the first and second polarizers 310 and 320.

The first and second open units OP1 and OP2 are areas from which portions of the first and second polarizers 310 and 320 are removed, and thus the first and second open units OP1 and OP2 may be substantially disposed to correspond to the active area ATA.

The first polarization axis PAX1 of the first polarizer 310 and the second polarization axis PAX2 of the second polarizer 320 are disposed to vertically intersect (or cross) with each other, and when the VA mode liquid crystal is utilized, the second panel 300 is driven in a normal black mode. In other words, when power is not applied to the second panel 300, light is not provided externally to shielded from the active area ATA in which the first and second polarizers 310 and 320 are substantially disposed.

When power is applied to the second panel 300, a light transmittance of the active area ATA may be adjusted by the liquid crystal layer VA_LC driven in the active area ATA. The normal black mode operation of the VA mode liquid crystal is known to those of ordinary skill in the art and therefore additional description thereof may be omitted.

An image on the image display areas IDA may be transmitted through the first open units OP1 of the first polarizer 310, the non-active areas NATA of the second panel 300, and the second open units OP2 of the second polarizer 320 to be provided externally.

Referring to FIG. 8, the second panel 300 may include a liquid crystal layer TN_LC disposed between the first substrate 310 and the second substrate 302, and the liquid crystal layer TN_LC may include a twisted nematic (TN) mode liquid crystal.

The first polarization axis PAX1 of the first polarizer 310 has an optical axis that is parallel to the first direction DR1. A second polarization axis PAX2' of a second polarizer 320' has an optical axis that is parallel to the first direction DR1. In other words, the first polarization axis PAX1 and the second polarization axis PAX2' are disposed to be parallel. Because other configurations of the second panel 300 and the first and second polarizers 310 and 320' illustrated in FIG. 8 are substantially the same as those of the second panel 300 and the first and second polarizers 310 and 320 described above with reference to FIG. 7, additional description thereof may be omitted.

When the first polarization axis PAX1 of the first polarizer 310 and the second polarization axis PAX2' of the second polarizer 320' are disposed to be parallel to each other, and the TN mode liquid crystal is utilized, the second panel 300 is driven in a normal black mode. For example, when power is not applied to the second panel 300, light is not provided externally to be shielded from the active area ATA, and when power is applied to the second panel 300, a light transmittance of the active area ATA may be adjusted by the liquid crystal layer TN_LC driven in the active area ATA. The normal black mode operation of the TN mode liquid crystal is known to those of ordinary skill in the art and therefore additional description thereof may be omitted.

Figure 9:
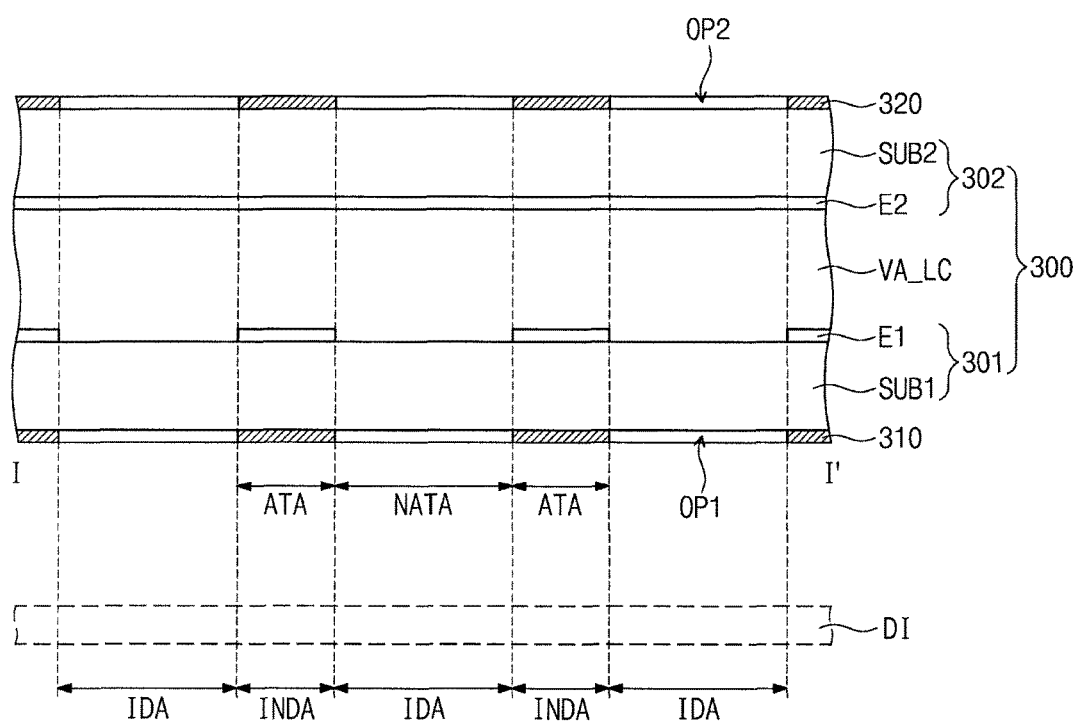
FIG. 9 is a cross-sectional view taken along the line I-I' illustrated in FIG. 6.

FIG. 9 is a cross-sectional view taken along the line I-I' illustrated in FIG. 6.

For convenience of explanation, FIG. 9 illustrates cross sectional views of the second panel 300 and the first and second polarizers 310 and 320 together. For example, the second panel 300 and the first and second polarizers 310 and 320 illustrated in FIG. 9 correspond to the second panel 300 and the first and second polarizers 310 and 320 illustrated in FIG. 7. However, the inventive concept is not limited thereto, and the second panel 300 and the first and second polarizers 310 and 320' illustrated in FIG. 8 may be also used in the display apparatus 400, for example.

Referring to FIG. 9, the first substrate 301 of the second panel 300 includes a first base substrate SUB1 and a first electrode E1 disposed on the first base substrate SUB1. The first electrode E1 is disposed on the active area ATA, but not on the non-active areas NATA. Accordingly, the first electrode E1 is disposed to overlap the image non-display area INDA of the display image DI and areas in which the first and second polarizers 310 and 320 are disposed.

The second substrate 302 of the second panel 300 includes a second base substrate SUB2 and a second electrode E2 disposed on the bottom surface of the second base substrate SUB2. The second electrode E2 may be entirely disposed on the bottom portion of the second substrate 302.

Figure 10:
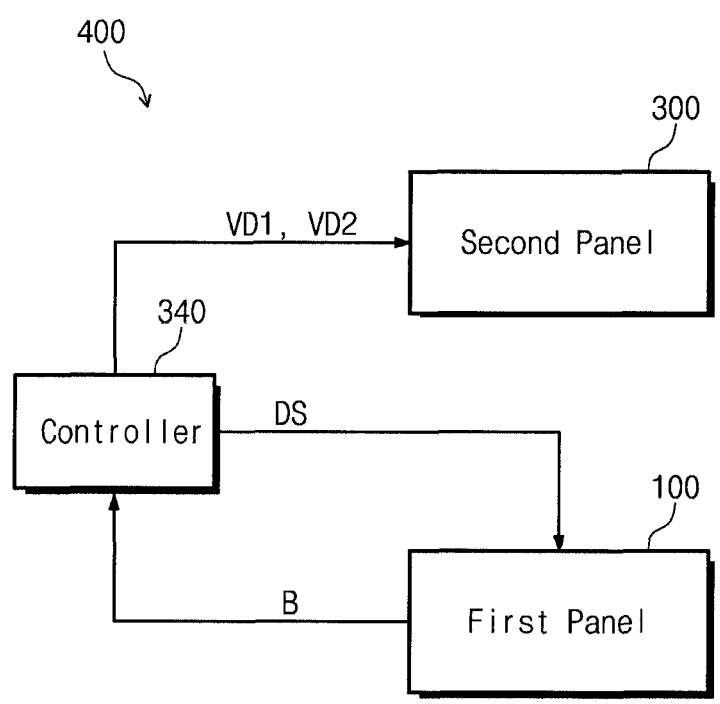
FIG. 10 schematically illustrates a block diagram of a display apparatus according to an embodiment of the inventive concept.
Figure 11:
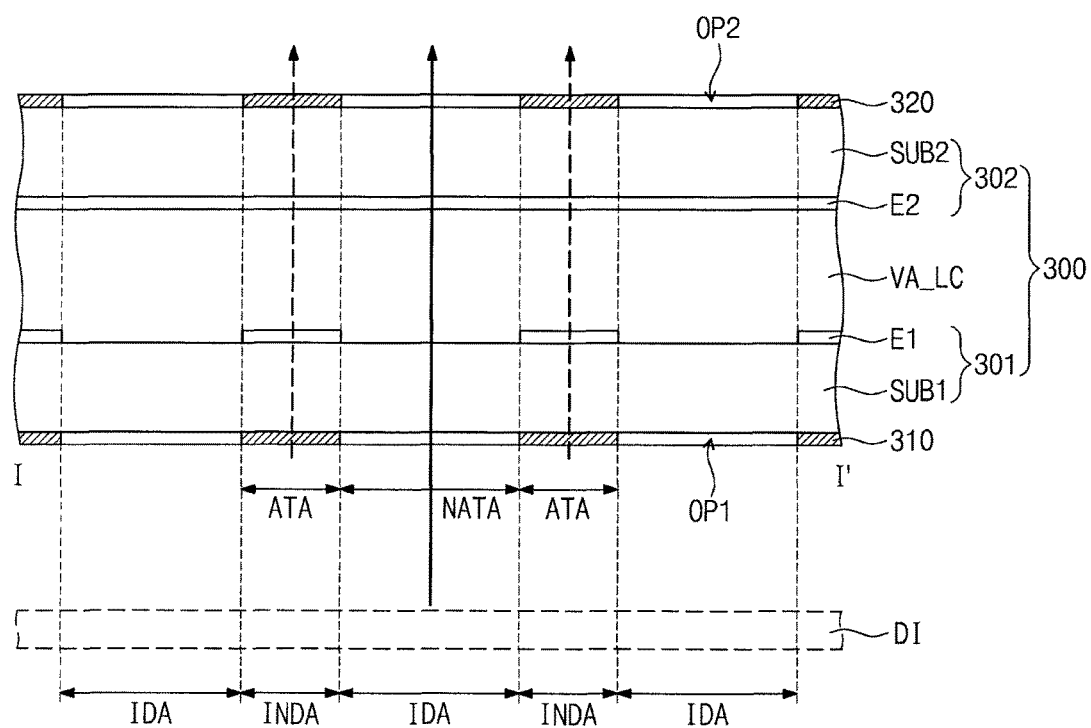
FIG. 11 exemplarily illustrates optical transmission through a second panel at a time of driving the second panel.

FIG. 10 schematically illustrates a block diagram of a display apparatus according to an embodiment of the inventive concept. FIG. 11 exemplarily illustrates optical transmission through the second panel at the time of driving the second panel.

Referring to FIGS. 10 and 11, the display apparatus 400 may include a controller 340 for driving the first panel 100 and the second panel 200. In some embodiments, the controller 340 may include a timing controller for generating control signals, a gate driver for generating gate signals in response to the control signals, and a data driver for generating data voltages in response to the control signals. The first panel 100 may be driven by receiving the gate signals and data voltages as a driving signal DS and may generate an image.

The controller 340 may provide a first voltage VD1 and a second voltage VD2 to the second panel 300. A voltage level of the first voltage VD1 varies and the second voltage VD2 has a constant voltage level. The controller 340 may detect a brightness B of the first panel 100 and adjust, according to the detected brightness B, the level of the first voltage VD1 provided to the second panel 300.

The brightness B of the first panel 100 is a brightness of an image generated by the first panel 100 and may be defined as an average brightness of the pixel areas PA. The controller 340 adjusts the voltage level of the first voltage VD1 such that as the brightness B of the first panel 100 becomes higher (or increases), a voltage difference between the first voltage VD1 and the second voltage VD2 becomes larger (or increases).

The second panel 300 may be driven by receiving the first voltage VD1 and the second voltage VD2 from the controller 340. The first voltage VD1 is provided to the first electrode E1 of the second panel 300, and the second voltage VD2 is provided to the second electrode E2 of the second panel 300.

An image displayed on the image display areas IDA of the display image DI may be transmitted through the first open units OP1 of the first polarizer 310, the non-active areas NATA of the second panel 300, and the second open units OP2 of the second polarizer 320 to be provided to the user.

The display image DI is an image generated by the first panel 100 and then enlarged N times (or enlarged by a magnitude of N). When the image generated by the first panel 100 is enlarged, not only the pixel areas PA, but also non-pixel area NPA, are enlarged. Accordingly, when the display image DI is directly provided to the user, the image non-display area of the display image DI may be visually recognized or recognizable.

For example, because the pixel-defined layer having a black color or the black matrix BM is disposed on the non-pixel area NPA, when the display image DI is directly provided to the user, the image non-display area INDA having a black color may be visually recognized or recognizable. When the brightness of the image generated by the first panel 100 is dark, for example, when the brightness of the display image DI is dark, the black image non-display area INDA may be relatively less visually recognized or recognizable. When the brightness of the imaged generated by the first panel 100 is bright, for example, when the brightness of the display image DI is bright, the black image non-display area INDA may be relatively more visually recognized or recognizable.

In an embodiment of the inventive concept, when the first voltage VD1 is applied to the first electrode E1 and the second voltage VD2 is applied to the second electrode E2, the liquid crystal layer VA_LC in the active area ATA is driven by a voltage difference between the first voltage VD1 and the second voltage VD2. Due to the driving of the liquid crystal layer VA_LC, a light transmissivity of the active area ATA may be adjusted. As the voltage difference between the first voltage VD1 and the second voltage VD2 becomes greater (or increases), the light transmissivity of the active area ATA becomes higher (or increases), and as the voltage difference between the first voltage VD1 and the second voltage VD2 becomes smaller (or decreases), the light transmissivity of the active area ATA becomes lower (or decreases).

For example, when the liquid crystal layer VA_LC is not driven, the active area ATA is driven in the normal black mode to shield the light, but as the voltage difference between the first voltage VD1 and the second voltage VD2 becomes greater (or increases), the liquid crystal layer VA_LC is driven greater and the brightness of the active area ATA may become high (or may increase). For convenience of explanation, light transmitted through the active area ATA is illustrated as a dotted line in FIG. 11.

When the brightness of the display image DI is dark (or relatively dark), the image non-display area INDA may be less visually recognized (or may be less recognizable). For example, the liquid crystal layer VA_LC is driven to lower the light transmissivity of the active area ATA, and therefore the brightness of the active area ATA becomes lower (or reduces). Because an image displayed on the image display areas IDA is a dark image, the active area ATA is controlled to be dark similarly to the image display areas IDA such that visual recognition of the image non-display area INDA may be prevented, or the likelihood thereof may be reduced.

When the brightness of the display image DI is bright (or relatively bright), the image non-display area INDA may be more visually recognized (or may be more recognizable). For example, the liquid crystal layer VA_LC is driven to raise the light transmissivity of the active area ATA, and therefore the brightness of the active area ATA increases (or becomes raised). Because an image displayed on the image display areas IDA is a bright image, the active area ATA is controlled to be bright similarly to the image display areas IDA such that visual recognition of the image non-display area INDA may be prevented, or the likelihood thereof may be reduced.

Consequently, the display apparatus 400 according to an embodiment of the inventive concept may enlarge an image generated by the first panel 100 and adjust the light transmissivity of the active area ATA of the second panel 300, which corresponds to the image non-display area INDA in the enlarged display image DI, to prevent the image non-display area INDA corresponding to the non-pixel area NPA from being visually recognized, or may reduce the likelihood thereof.

Figure 12:
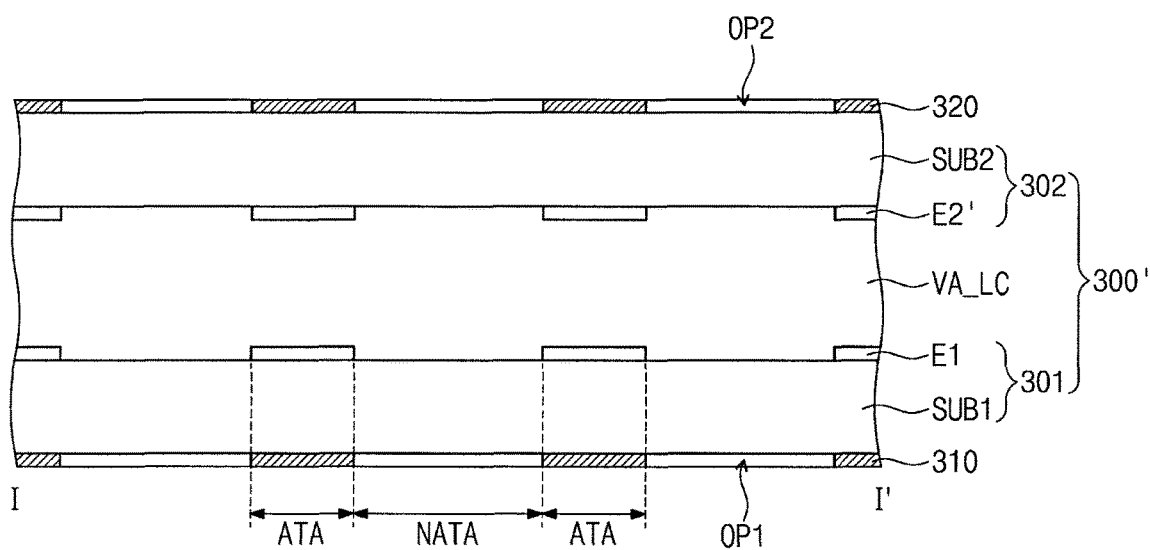
FIG. 12 exemplarily illustrates a configuration of a second panel of a display apparatus according to another embodiment of the inventive concept.

FIG. 12 exemplarily illustrates a configuration of a second panel 300' of a display apparatus according to another embodiment of the inventive concept.

For convenience of explanation, the second panel 300' in FIG. 12 is illustrated in a cross sectional view corresponding to the cross-sectional view illustrated in FIG. 9. The second panel 300' illustrated in FIG. 12 may have substantially the same configuration as the second panel 300 illustrated in FIG. 9, with the exception of a configuration of the second electrode E2'.

Referring to FIG. 12, the second electrode E2' of the second panel 300' may be disposed on (or at) a bottom portion (or a lower portion) of the second base substrate SUB2 of the active area ATA. For example, the second electrode E2' may be disposed in (or at) the active area ATA to overlap the first electrode E1. Because the other components of the second panel 300' may be substantially the same as (or identical to) those of the second panel 300 illustrated in FIG. 9, additional descriptions thereof may be omitted.

According to a display apparatus according to an embodiment of the inventive concept, a non-pixel area may be prevented from being visually recognized by enlarging an image generated by a first panel and adjusting a light transmissivity of an active area of a second panel corresponding to an image non-display area in the enlarged image, or likelihood thereof may be reduced.

While this disclosure has been described in connection with what are presently considered to be some practical exemplary embodiments, it is to be understood that the invention is not limited to the disclosed embodiments, but, on the contrary, is intended to cover various modifications and equivalent arrangements included within the spirit and scope of the appended claims, and their equivalents.

What is claimed is:

1. A display apparatus comprising:
   a first panel comprising:
      a plurality of pixel areas configured to provide an image; and
      a non-pixel area around the plurality of pixel areas;
   a lens unit on the first panel and configured to enlarge the image by a magnitude of N to generate a display image; and
   a second panel on the lens unit, the second panel being larger than the first panel by a magnitude of N, and comprising:
      a plurality of non-active areas corresponding to the plurality of pixel areas; and
      an active area around the plurality of non-active areas, and corresponding to the non-pixel area;
      a first substrate comprising a first electrode at the active area;
      a second substrate comprising a second electrode facing the first electrode; and
      a light transmission adjusting layer between the first substrate and the second substrate,
   wherein N is a rational number greater than 1.

2. The display apparatus of claim 1, wherein the display image comprises:
   a plurality of image display areas corresponding to the plurality of pixel areas; and
   an image non-display area around the plurality of image display areas and corresponding to the non-pixel area, wherein the non-active areas overlap the image display areas and the active area overlaps the image non-display area.

3. The display apparatus of claim 2, wherein the light transmission adjusting layer is configured to transmit light in the non-active areas and is configured to adjust a light transmission amount in the active area.

4. The display apparatus of claim 1, wherein the light transmission adjusting layer comprises a liquid crystal layer.

5. The display apparatus of claim 4, further comprising:
   a first polarizer at a first surface of the first substrate, a plurality of first open units overlapping with the plurality of non-active areas being defined in the first polarizer, the first polarizer having a first polarization axis; and
   a second polarizer at a second surface of the second substrate, a plurality of second open units overlapping with the plurality of non-active areas being defined in the second polarizer, the second polarizer having a second polarization axis.

6. The display apparatus of claim 5, wherein the first polarization axis and the second polarization axis intersect with each other, and
   wherein the liquid crystal layer comprises a vertical alignment (VA) mode liquid crystal.

7. The display apparatus of claim 5, wherein the first polarization axis and the second polarization axis are parallel to each other, and
   wherein the liquid crystal layer comprises a twisted nematic (TN) mode liquid crystal.

8. The display apparatus of claim 4, wherein the liquid crystal layer adjusts a light transmissivity in the active area according to a voltage difference between a first voltage applied to the first electrode and a second voltage applied to the second electrode, and
   wherein a voltage level of the first voltage is variable and the second voltage has a constant voltage level.

9. The display apparatus of claim 8, further comprising a controller configured to detect a brightness of the first panel and configured to adjust the voltage level of the first voltage according to the detected brightness.

10. The display apparatus of claim 9, wherein the controller is configured to control the voltage level of the first voltage such that the voltage difference between the first voltage and the second voltage increases as the brightness of the first panel increases.

11. The display apparatus of claim 1, wherein the first panel comprises organic light emitting diodes respectively at ones of the pixel areas from among the plurality of pixel areas.

12. The display apparatus of claim 11, wherein the first panel further comprises a pixel-defined layer at the non-pixel area.

13. The display apparatus of claim 1, wherein the first panel comprises liquid crystal display elements respectively at ones of the pixel areas from among the plurality of pixel areas.

14. The display apparatus of claim 13, wherein the first panel further comprises a black matrix at the non-pixel area.

15. The display apparatus of claim 1, wherein the second electrode is entirely at the second substrate.

16. The display apparatus of claim 1, wherein the second electrode is at the active area on the second substrate.

* * * * *